(12) United States Patent
Masuda

(10) Patent No.: US 9,054,022 B2
(45) Date of Patent: *Jun. 9, 2015

(54) METHOD FOR MANUFACTURING SEMICONDUCTOR DEVICE

(75) Inventor: Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/579,815

(22) PCT Filed: Jul. 29, 2011

(86) PCT No.: PCT/JP2011/067501
§ 371 (c)(1),
(2), (4) Date: Aug. 17, 2012

(87) PCT Pub. No.: WO2012/017958
PCT Pub. Date: Feb. 9, 2012

(65) Prior Publication Data
US 2012/0309195 A1   Dec. 6, 2012

(30) Foreign Application Priority Data
Aug. 3, 2010   (JP) .................. 2010-174664

(51) Int. Cl.
*H01L 21/336* (2006.01)
*H01L 29/16* (2006.01)
*H01L 29/04* (2006.01)
(Continued)

(52) U.S. Cl.
CPC .......... *H01L 29/1608* (2013.01); *H01L 29/045* (2013.01); *H01L 29/0623* (2013.01); *H01L 29/4236* (2013.01); *H01L 29/66068* (2013.01); *H01L 29/7397* (2013.01); *H01L 29/7813* (2013.01); *H01L 29/8613* (2013.01); *H01L 21/3065* (2013.01); *H01L 21/0445* (2013.01)

(58) Field of Classification Search
USPC ............. 257/77, E21.054, E21.065, E21.182, 257/E21.214; 438/46, 197, 270, 285, 701, 438/779, 931
See application file for complete search history.

(56) References Cited

U.S. PATENT DOCUMENTS 5,744,826 A      4/1998   Takeuchi et al.
5,976,936 A  *  11/1999   Miyajima et al. ............. 438/268
(Continued)

FOREIGN PATENT DOCUMENTS

CN       101542739 A      9/2009
EP         1612851 A1     1/2006
(Continued)

OTHER PUBLICATIONS

Yano et al., "SiO2/SiC Interface Properties on Various Surface orientations" Mat. Res. Soc. Symp. Proc, vol. 742, 2003, pp. 219-226.*
(Continued)

*Primary Examiner* — Asok K Sarkar
(74) *Attorney, Agent, or Firm* — Venable LLP; Michael A. Sartori; Tamatane J. Aga

(57) ABSTRACT

A method for manufacturing a high-quality semiconductor device having stable characteristics is provided. The method for manufacturing the semiconductor device includes the steps of: preparing a silicon carbide layer having a main surface; forming a trench in the main surface by removing a portion of the silicon carbide layer; and removing a portion of a side wall of the trench by thermal etching.

7 Claims, 10 Drawing Sheets

(51) Int. Cl.
*H01L 29/423* (2006.01)
*H01L 29/66* (2006.01)
*H01L 29/739* (2006.01)
*H01L 29/78* (2006.01)
*H01L 29/861* (2006.01)
*H01L 21/3065* (2006.01)
*H01L 21/04* (2006.01)
*H01L 29/06* (2006.01)

(56) References Cited

U.S. PATENT DOCUMENTS

| | | | |
|---|---|---|---|
| 6,020,600 | A | 2/2000 | Miyajima et al. |
| 6,133,587 | A | 10/2000 | Takeuchi et al. |
| 6,452,228 | B1 | 9/2002 | Okuno et al. |
| 6,734,461 | B1 | 5/2004 | Shiomi et al. |
| 2003/0012925 | A1 | 1/2003 | Gorrell |
| 2003/0075765 | A1 | 4/2003 | Ohnakado et al. |
| 2003/0137012 | A1 | 7/2003 | Yamaguchi et al. |
| 2003/0227061 | A1* | 12/2003 | Yokogawa et al. ........... 257/379 |
| 2006/0214268 | A1 | 9/2006 | Maeyama et al. |
| 2006/0249073 | A1 | 11/2006 | Asaoka et al. |
| 2007/0026632 | A1 | 2/2007 | Yamamoto |
| 2007/0057262 | A1 | 3/2007 | Nakamura et al. |
| 2007/0090370 | A1 | 4/2007 | Nakayama et al. |
| 2007/0200116 | A1* | 8/2007 | Harris et al. ................... 257/77 |
| 2007/0210316 | A1 | 9/2007 | Yonezawa et al. |
| 2007/0267663 | A1 | 11/2007 | Harada |
| 2008/0032880 | A1 | 2/2008 | Maruyama et al. |
| 2008/0213536 | A1 | 9/2008 | Maruyama et al. |
| 2008/0230787 | A1 | 9/2008 | Suzuki et al. |
| 2009/0114982 | A1* | 5/2009 | Saka et al. ..................... 257/330 |
| 2009/0200559 | A1 | 8/2009 | Suzuki et al. |
| 2010/0062582 | A1 | 3/2010 | Fujikawa |
| 2010/0261333 | A1 | 10/2010 | Nakayama et al. |
| 2010/0314626 | A1 | 12/2010 | Harada et al. |
| 2011/0121316 | A1 | 5/2011 | Harada |
| 2011/0175110 | A1 | 7/2011 | Wada et al. |
| 2011/0201187 | A1 | 8/2011 | Nishiwaki et al. |
| 2011/0233560 | A1 | 9/2011 | Koike et al. |
| 2012/0161154 | A1* | 6/2012 | Mimura et al. ................. 257/77 |
| 2012/0205670 | A1 | 8/2012 | Kudou et al. |
| 2012/0228640 | A1 | 9/2012 | Masuda et al. |
| 2012/0248461 | A1 | 10/2012 | Masuda et al. |
| 2014/0203300 | A1 | 7/2014 | Hatayama et al. |

FOREIGN PATENT DOCUMENTS

| | | |
|---|---|---|
| JP | 7-326755 | 12/1995 |
| JP | 08-070124 A | 3/1996 |
| JP | 09-74191 A | 3/1997 |
| JP | 9-199724 A | 7/1997 |
| JP | 2000-021849 A | 1/2000 |
| JP | 2001-002499 A | 1/2001 |
| JP | 2001-503726 A | 3/2001 |
| JP | 2004-292305 A | 10/2004 |
| JP | 2005-056868 | 3/2005 |
| JP | 2005-223255 A | 8/2005 |
| JP | 2005-294872 A | 10/2005 |
| JP | 2005-328013 A | 11/2005 |
| JP | 2005-340685 | 12/2005 |
| JP | 2006-016288 A | 1/2006 |
| JP | 2006-228901 A | 8/2006 |
| JP | 2006-303469 A | 11/2006 |
| JP | 2007-035823 A | 2/2007 |
| JP | 2007-053227 A | 3/2007 |
| JP | 2007-080971 | 3/2007 |
| JP | 2007-165657 A | 6/2007 |
| JP | 2007-182330 A | 7/2007 |
| JP | 2007-311627 A | 11/2007 |
| JP | 2008-135534 A | 6/2008 |
| JP | 2008-135653 A | 6/2008 |
| JP | 2008-235546 A | 10/2008 |
| JP | 2009-523324 A | 6/2009 |
| JP | 2009-170456 A | 7/2009 |
| JP | 2009-289987 A | 12/2009 |
| JP | 2010-040564 A | 2/2010 |
| JP | 2010-062381 A | 3/2010 |
| JP | 2010-103326 A | 5/2010 |
| JP | 2010-147222 A | 7/2010 |
| JP | 2011-044513 A | 3/2011 |
| WO | WO-98/21386 | 5/1998 |
| WO | WO-02/097852 A2 | 12/2002 |
| WO | WO-2005/116307 A1 | 12/2005 |
| WO | WO-2007/081964 A2 | 7/2007 |
| WO | WO-2011/048800 A1 | 4/2011 |
| WO | WO-2012/017796 A1 | 2/2012 |
| WO | WO-2013/031172 A1 | 7/2013 |

OTHER PUBLICATIONS

Office Action in U.S. Appl. No. 13/805,279, dated Mar. 24, 2014.
Notice of Grounds of Rejection in Japanese Patent Application No. 2012-527720, dated Aug. 19, 2014.
Notice of Grounds of Rejection issued in Japanese Patent Application No. 2011-208679 dated Jan. 6, 2015.
Notice of Grounds of Rejection issued in Japanese Patent Application No. 2011-253614 dated Jan. 13, 2015.
Takenami et al., "Sloped Sidewalls in 4H-SiC Mesa Structure Formed by a Cl2-O2 Thermal Etching," Materials Science Forums, vol. 556-557 (2007) pp. 733-736.
International Search Report and Written Opinion issued in PCT Patent Application No. PCT/JP2011/066096 dated Oct. 25, 2011.
Notification of First Office Action issued in Chinese Patent Application No. 201180018742.1 dated Oct. 15, 2014.
International Search Report and Written Opinion issued in PCT Patent Application No. PCT/JP2011/067501 dated Nov. 8, 2011.
Office Action issued in U.S. Appl. No. 13/613,785 dated Dec. 6, 2013.
Office Action issued in U.S. Appl. No. 13/613,785 dated Mar. 20, 2014.
International Search Report and Written Opinion issued in PCT Patent Application No. PCT/JP2012/070681 dated Nov. 20, 2012.
Office Action issued in U.S. Appl. No. 13/607,388 dated Dec. 24, 2013.
Notice of Grounds of Rejection issued in Japanese Patent Application No. 2011-200247 dated Nov. 18, 2014.
International Search Report and Written Opinion issued in PCT Patent Application No. PCT/JP2012/070658 dated Nov. 27, 2012.
"Epitaxial Devices—Characteristics—Electronic Circuits and Diagram—Electronics Projects and design," Jun. 11, 2010, accessed from the Internet on Aug. 26, 2013 from: http://www.circuitstoday.com/epitaxial-devices-characteristics.
Office Action issued in U.S. Appl. No. 13/613,838 dated Sep. 16, 2013.
Office Action issued in U.S. Appl. No. 13/613,838 dated Mar. 3, 2014.
International Search Report and Written Opinion issued in PCT Patent Application No. PCT/JP2012/069790 dated Sep. 18, 2012.
Office Action issued in U.S. Appl. No. 13/658,583 dated Mar. 29, 2013.
International Search Report and Written Opinion issued in PCT Patent Application No. PCT/JP2012/075516 dated Nov. 27, 2012.
Hatayama et al., "Evaluation of Crystallinity in 4H-SiC{0001} Epilayers Thermally Etched by Chlorine and Oxygen System," Japanese Journal of Applied Physics, vol. 45, No. 27, 2006, pp. L690-L693.
Extended European Search Report issued in European Patent Application No. 11814584.6 dated Jan. 21, 2015.

* cited by examiner

METHOD FOR MANUFACTURING SEMICONDUCTOR DEVICE

TECHNICAL FIELD

The present invention relates to a method for manufacturing a semiconductor device, more particularly, a method for manufacturing a semiconductor device utilizing an inclined surface formed in a silicon carbide layer and including a predetermined crystal plane.

BACKGROUND ART

Conventionally, it has been proposed to use silicon carbide (SiC) as a material for a semiconductor device. For example, it has been proposed to form a trench gate-type MOSFET using silicon carbide (see Japanese Patent Laying-Open No. 2008-235546 (Patent Literature 1)).

Japanese Patent Laying-Open No. 2008-235546 proposes forming a trench having a gate electrode and a gate insulating film arranged therein to have a tapered side wall in order to improve breakdown voltage of the gate insulating film in a trench gate-type MOSFET. Specifically, by removing a portion of a semiconductor layer made of silicon carbide by anisotropic etching using an etching mask having an opening pattern, and thereafter performing isotropic etching, a trench is formed in the semiconductor layer to have a tapered side wall.

CITATION LIST

Patent Literature

PTL 1: Japanese Patent Laying-Open No. 2008-235546

SUMMARY OF INVENTION

Technical Problem

Here, for example, concerning silicon carbide of hexagonal crystal type, it has been conventionally reported that high channel mobility can be achieved by utilizing a so-called semi-polar plane such as a plane having a plane orientation of {03-3-8} as a channel in a semiconductor device such as a MOSFET. However, Patent Literature 1 does not directly disclose forming a semi-polar plane as described above as a channel in a trench gate-type MOSFET (i.e., forming a trench to have a side wall constituted by a semi-polar plane), and Patent Literature 1 is silent about a specific method for forming a trench to have a side wall corresponding to a semi-polar plane. Specifically, merely processing a side wall of a trench by isotropic etching to have a tapered shape as disclosed in Patent Literature 1 does not result in a formed side wall which accurately corresponds to the above-described semi-polar plane. In this case, there has been a problem that characteristics (for example, channel mobility) of a formed semiconductor device are not sufficiently improved.

The present invention has been made to solve the foregoing problem, and one object of the present invention is to provide a method for manufacturing a semiconductor device capable of obtaining a high-quality semiconductor device having stable characteristics.

Solution to Problem

A method for manufacturing a semiconductor device according to the present invention includes the steps of preparing a silicon carbide layer having a main surface; forming a trench in the main surface by removing a portion of the silicon carbide layer; and removing a portion of a side wall of the trench by thermal etching.

In this way, by removing a portion of the side wall of the trench by thermal etching, the side wall of the trench can be spontaneously formed to correspond to a semi-polar plane such as a {03-3-8} plane. Further, since a portion of the side wall of the trench is removed using thermal etching, a process-damaged layer or the like is not formed in the side wall of the processed trench. Therefore, a high-quality semiconductor device using the side wall of the trench corresponding to the semi-polar plane as a channel can be manufactured.

Further, when a portion of the side wall of the trench is removed by thermal etching as described above, even if a process-damaged layer is generated in the side wall, the process-damaged layer can be removed by sufficiently increasing the thickness of the surface of the side wall to be removed (for example, by setting the thickness of the surface of the side wall to be removed to not less than 0.1 μm).

Further, as a result of diligent study, the inventors have found that, by processing a silicon carbide single-crystal under predetermined conditions, a so-called semi-polar plane can be formed as a spontaneously formed surface, and that, by using the semi-polar plane thus spontaneously formed as an active region (for example, a channel region) of a semiconductor device, a semiconductor device excellent in electrical characteristics (for example, having high channel mobility) can be realized.

Based on such findings of the inventors, a semiconductor device according to the present invention includes a substrate having a main surface, and a silicon carbide layer. The silicon carbide layer is formed on the main surface of the substrate. The silicon carbide layer includes an end surface inclined relative to the main surface. The end surface substantially includes one of a {03-3-8} plane and a {01-1-4} plane in a case where the silicon carbide layer is of hexagonal crystal type, and substantially includes a {100} plane in a case where the silicon carbide layer is of cubic crystal type.

It should be noted that the expression "the end surface substantially includes one of the {03-3-8} plane and the {01-1-4} plane" refers to a case where a crystal plane constituting the end surface is one of the {03-3-8} plane and the {01-1-4} plane, and a case where the crystal plane constituting the end surface is a plane having an off angle of not less than −3° and not more than 3° relative to the {03-3-8} plane or the {01-1-4} plane in the <1-100> direction. It should also be noted that the "off angle relative to the {03-3-8} plane or the {01-1-4} plane in the <1-100> direction" refers to an angle formed by an orthogonal projection of a normal line of the above-described end surface to a flat plane defined by the <1-100> direction and the <0001> direction, and a normal line of the {03-3-8} plane or the {01-1-4} plane. The sign of positive value corresponds to a case where the orthogonal projection approaches in parallel with the <1-100> direction whereas the sign of negative value corresponds to a case where the orthogonal projection approaches in parallel with the <0001> direction. Further, the expression "the end surface substantially includes the {100} plane" refers to a case where the crystal plane constituting the end surface is the {100} plane, and a case where the crystal plane constituting the end surface is a crystal plane having an off angle of not less than −3° and not more than 3° relative to the {100} plane in any crystal orientation.

In this way, the end surface of the silicon carbide layer substantially corresponds to any one of the {03-3-8} plane, the {01-1-4} plane, and the {100} plane. Hence, the end surface corresponding to the so-called semi-polar plane can be used as an active region of the semiconductor device. Because the end surface thus corresponds to the stable crystal plane, leakage current can be stably reduced sufficiently and high breakdown voltage can be obtained in a case where the end surface is employed for the active region such as the channel region, as compared with a case where another crystal plane (such as a (0001) plane) is employed for the active region.

In addition, the inventors have found that, by heating a silicon carbide layer (silicon carbide single-crystal layer) while exposing the silicon carbide layer to a reaction gas containing oxygen and chlorine, a crystal plane allowing for the slowest etching rate is spontaneously formed in the silicon carbide. The inventors have also found that, by adjusting composition of the reaction gas (for example, the ratio between oxygen and chlorine) and heating temperature, the {03-3-8} plane, the {01-1-4} plane, or the {100} plane described above can be spontaneously formed. Based on such findings, a method for manufacturing a semiconductor device according to the present invention includes the steps of preparing a substrate on which a silicon carbide layer is formed, forming an end surface inclined relative to a main surface of the silicon carbide layer, and forming a structure included in the semiconductor device, using the end surface. In the step of forming the end surface, a portion of the main surface of the silicon carbide layer is removed by etching by heating the silicon carbide layer while exposing the silicon carbide layer to a reaction gas containing oxygen and chlorine. Accordingly, the end surface inclined relative to the main surface of the silicon carbide layer is formed. The end surface substantially includes one of a {03-3-8} plane and a {01-1-4} plane in a case where the silicon carbide layer is of hexagonal crystal type, and substantially includes a {100} plane in a case where the silicon carbide layer is of cubic crystal type. In this case, the semiconductor device according to the present invention can be readily manufactured. Further, since the {03-3-8} plane, the {01-1-4} plane, or the {100} plane can be spontaneously formed by performing etching (thermal etching) as described above, there is no need to employ liquid phase growth or the like to form these crystal planes. Thus, impurity concentration in the above crystal plane is unlikely to vary in the spontaneous formation process. Therefore, the impurity concentration in the crystal plane can be readily controlled by a method such as ion implantation.

Advantageous Effects of Invention

According to the present invention, a semiconductor device having excellent characteristics with stably reduced leakage current and high breakdown voltage can be obtained.

DESCRIPTION OF EMBODIMENTS

Figure 1:
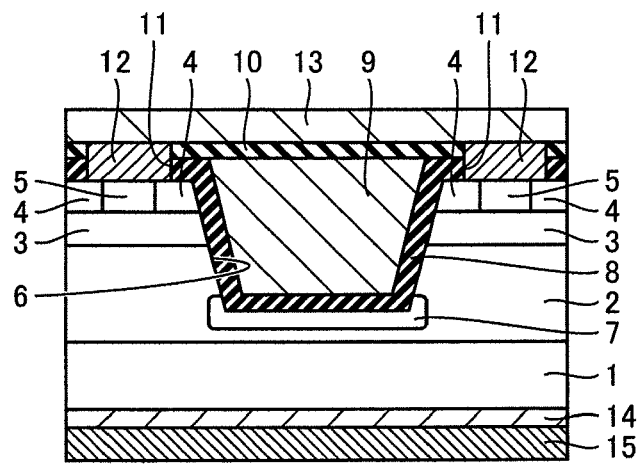
FIG. 1 is a schematic cross sectional view showing a first embodiment of a semiconductor device according to the present invention.

The following describes embodiments of the present invention with reference to the drawings. It should be noted that in the below-mentioned drawings, the same or corresponding portions are given the same reference characters and are not described repeatedly. Further, in the present specification, an individual orientation is represented by [ ], a group orientation is represented by < >, an individual plane is represented by ( ), and a group plane is represented by { }. In addition, a negative index is supposed to be crystallographically indicated by putting "–" (bar) above a numeral, but is indicated by putting the negative sign before the numeral in the present specification.

First Embodiment

Referring to FIG. 1, a first embodiment of a semiconductor device in the present invention will be described.

Referring to FIG. 1, the semiconductor device in the present invention is a vertical type MOSFET, which is a vertical type device employing a trench having an inclined side surface. The semiconductor device shown in FIG. 1 includes: a substrate 1 made of silicon carbide; a breakdown voltage holding layer 2 made of silicon carbide and serving as an epitaxial layer having n type conductivity; p type body layers 3 (p type semiconductor layers 3) made of silicon carbide and having p type conductivity; n type source contact layers 4 made of silicon carbide and having n type conductivity; contact regions 5 made of silicon carbide and having p type conductivity; a gate insulating film 8; a gate electrode 9; an interlayer insulating film 10; source electrodes 12; a source wire electrode 13; a drain electrode 14; and a backside surface protecting electrode 15.

Substrate 1 is made of silicon carbide of hexagonal crystal type or silicon carbide of cubic crystal type. Breakdown voltage holding layer 2 is formed on one main surface of substrate 1. Each of p type body layers 3 is formed on breakdown voltage holding layer 2. On p type body layer 3, n type source contact layer 4 is formed. P type contact region 5 is formed to be surrounded by n type source contact layer 4. Trench 6 is formed by removing portions of n type source contact layer 4, p type body layer 3, and breakdown voltage holding layer 2. Each of the side walls of trench 6 serves as an end surface inclined relative to the main surface of substrate 1. The inclined end surface surrounds a projection portion (projection-shaped portion having an upper surface on which source electrode 12 is formed). If substrate 1 is of hexagonal crystal type, the projection portion may have, for example, a hexagonal planar shape. Further, if substrate 1 is of cubic crystal type, the projection portion may have, for example, a quadrangular planar shape.

Gate insulating film 8 is formed on the side walls and bottom wall of trench 6. Gate insulating film 8 extends onto the upper surface of each of n type source contact layers 4. Gate electrode 9 is formed on gate insulating film 8 to fill the inside of trench 6. Gate electrode 9 has an upper surface substantially as high as the upper surface of a portion of gate insulating film 8 on the upper surface of each of n type source contact layers 4.

Interlayer insulating film 10 is formed to cover gate electrode 9 as well as the portion of gate insulating film 8 extending onto the upper surface of each of n type source contact layers 4. By removing portions of interlayer insulating film 10 and gate insulating film 8, openings 11 are formed to expose portions of n type source contact layers 4 and p type contact regions 5. Source electrodes 12 are formed in contact with p type contact regions 5 and the portions of n type source contact layers 4 so as to fill the inside of openings 11. Source wire electrode 13 is formed in contact with the upper surface of each of source electrodes 12 so as to extend on the upper surface of interlayer insulating film 10. Further, drain electrode 14 is formed on the backside surface of substrate 1 opposite to its main surface on which breakdown voltage holding layer 2 is formed. This drain electrode 14 is an ohmic electrode. Drain electrode 14 has a surface which is opposite to its surface facing substrate 1 and on which backside surface protecting electrode 15 is formed.

In the semiconductor device shown in FIG. 1, each of the side walls of trench 6 is inclined and substantially corresponds to one of a {03-3-8} plane and a {01-1-4} plane in a case where the silicon carbide constituting breakdown voltage holding layer 2 and the like is of hexagonal crystal type. Further, the inclined side wall of trench 6 substantially corresponds to a {100} plane in a case where the silicon carbide constituting breakdown voltage holding layer 2 and the like is of cubic crystal type. As seen from FIG. 1, each of the side walls thus corresponding to the so-called semi-polar plane can be used as a channel region, which is an active region of the semiconductor device. Because each of the side walls corresponds to the stable crystal plane, leakage current can be reduced sufficiently and high breakdown voltage can be obtained in a case where such a side wall is employed for the channel region, as compared with a case where another crystal plane (such as a (0001) plane) is employed for the channel region.

The following briefly describes operations of the semiconductor device shown in FIG. 1. Referring to FIG. 1, when a voltage equal to or smaller than a threshold value is applied to gate electrode 9, i.e., when the semiconductor device is in an OFF state, p type body layer 3 and breakdown voltage holding layer 2 of n type conductivity are reverse-biased. Hence, they are in a non-conductive state. On the other hand, when gate electrode 9 is fed with a positive voltage, an inversion layer is formed in the channel region near a region of p type body layer 3 in contact with gate insulating film 8. Accordingly, n type source contact layer 4 and breakdown voltage holding layer 2 are electrically connected to each other. As a result, a current flows between source electrode 12 and drain electrode 14.

The following describes a method for manufacturing the semiconductor device shown in FIG. 1 in the present invention, with reference to FIG. 2 to FIG. 9.

Figure 2:
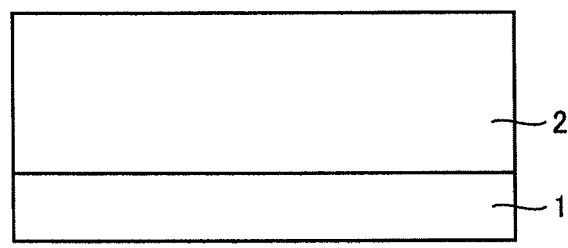
FIG. 2 is a schematic cross sectional view for illustrating a method for manufacturing the semiconductor device shown in FIG. 1.

First, referring to FIG. 2, on the main surface of substrate 1 made of silicon carbide, an epitaxial layer of silicon carbide with n type conductivity is formed. The epitaxial layer serves as breakdown voltage holding layer 2. Breakdown voltage holding layer 2 is formed by means of epitaxial growth employing a CVD method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as an impurity of n type conductivity, for example. Breakdown voltage holding layer 2 can contain the n type impurity at a concentration of, for example, not less than $5 \times 10^{15}$ cm$^{-3}$ and not more than $5 \times 10^{16}$ cm$^{-3}$.

Next, ions are implanted into the upper surface layer of breakdown voltage holding layer 2, thereby forming p type body layer 3 and n type source contact layer 4. In the ion implantation for forming p type body layer 3, ions of an impurity of p type conductivity such as aluminum (Al) are implanted. In doing so, by adjusting acceleration energy of the ions to be implanted, the depth of the region in which p type body layer 3 is to be formed can be adjusted.

Figure 3:
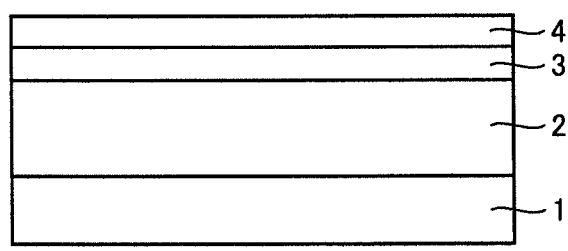
FIG. 3 is a schematic cross sectional view for illustrating the method for manufacturing the semiconductor device shown in FIG. 1.

Next, ions of an impurity of n type conductivity are implanted into breakdown voltage holding layer 2 thus having p type body layer 3 formed therein, thereby forming n type source contact layer 4. An exemplary, usable n type impurity is phosphorus or the like. In this way, a structure shown in FIG. 3 is obtained.

Figure 4:
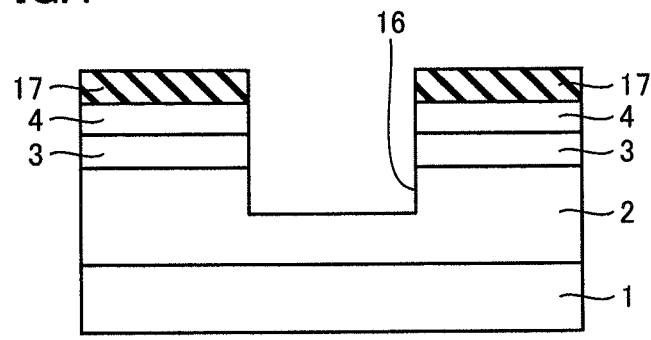
FIG. 4 is a schematic cross sectional view for illustrating the method for manufacturing the semiconductor device shown in FIG. 1.

Next, as shown in FIG. 4, a mask layer 17 is formed on the upper surface of n type source contact layer 4. As mask layer 17, an insulating film such as a silicon oxide film can be used. As a method for forming mask layer 17, the following process can be employed, for example. That is, a silicon oxide film is formed on the upper surface of n type source contact layer 4 by means of the CVD method or the like. Then, a resist film (not shown) having a predetermined opening pattern is formed on the silicon oxide film by means of a photolithography method. Using the resist film as a mask, a portion of the silicon oxide film is removed by etching. Thereafter, the resist film is removed. As a result, mask layer 17 is formed which has an opening pattern in conformity with a region where a trench 16 shown in FIG. 4 is to be formed. It should be noted that the opening pattern in mask layer 17 can have a width of, for example, not less than 0.1 μm and not more than 2 μm. In a case where such a fine opening pattern is used, a residue is likely to occur within the opening pattern, and thus the present invention is particularly effective.

Then, using mask layer 17 as a mask, portions of n type source contact layer 4, p type body layer 3, and breakdown voltage holding layer 2 are removed by means of etching. An exemplary, usable etching method is reactive ion etching (RIE), in particular, inductively coupled plasma (ICP) RIE. Specifically, for example, ICP-RIE can be used which employs $SF_6$ or a mixed gas of $SF_6$ and $O_2$ as a reaction gas. By means of such etching, trench 16 having a side wall substantially perpendicular to the main surface of substrate 1 can be formed in a region where trench 6 shown in FIG. 1 is to be formed. In this way, a structure shown in FIG. 4 is obtained.

Figure 5:
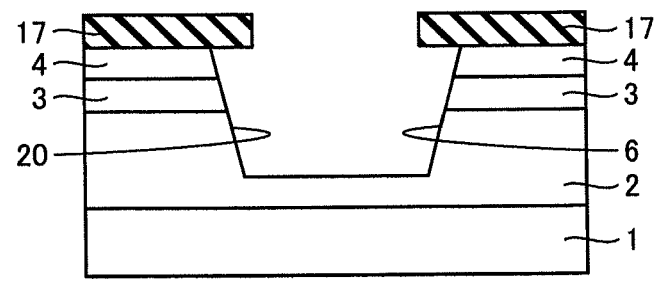
FIG. 5 is a schematic cross sectional view for illustrating the method for manufacturing the semiconductor device shown in FIG. 1.

Next, a thermal etching step is performed to exhibit a predetermined crystal plane in each of breakdown voltage holding layer 2, p type body layer 3, and n type source contact layer 4. Specifically, each of the side walls of trench 16 shown in FIG. 4 is etched (thermally etched) at a heat treatment temperature of, for example, not less than 700° C. and not more than 1000° C. using a mixed gas of oxygen gas and chlorine gas as a reaction gas, thereby forming trench 6 having side surfaces 20 inclined relative to the main surface of substrate 1 as shown in FIG. 5. It should be noted that, if there is a process-damaged layer in the side walls of trench 16, the process-damaged layer is removed by sufficiently increasing a time period for the thermal etching step.

Here, as a condition for the thermal etching step, for example, a ratio of a flow rate of chlorine gas to a flow rate of oxygen gas ((flow rate of chlorine gas)/(flow rate of oxygen gas)) can be set to not less than 0.5 and not more than 4.0, more preferably not less than 1.0 and not more than 2.0. It should be noted that the reaction gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 μm/hr. Further, when silicon oxide ($SiO_2$) is used as mask layer 17 in this case, a selection ratio of SiC to $SiO_2$ can be very high. Accordingly, mask layer 17 made of $SiO_2$ is not substantially etched during etching of SiC.

It should be noted that the crystal plane exhibited at each of side surfaces 20 corresponds to, for example, the {03-3-8} plane. Namely, in the etching under the above-described conditions, side surface 20 of trench 6 is spontaneously formed to correspond to the {03-3-8} plane, which is a crystal plane allowing for the slowest etching rate. As a result, a structure as shown in FIG. 5 is obtained. It should be noted that the crystal plane constituting side surface 20 may be the {01-1-4} plane. Further, in the case where the silicon carbide constituting breakdown voltage holding layer 2 and the like is of cubic crystal type, the crystal plane constituting side surface 20 may be the {100} plane.

Figure 6:
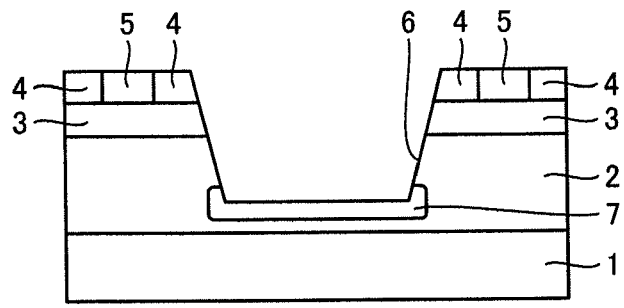
FIG. 6 is a schematic cross sectional view for illustrating the method for manufacturing the semiconductor device shown in FIG. 1.

Next, mask layer 17 is removed by any method such as etching. Thereafter, a resist film (not shown) having a predetermined pattern is formed using the photolithography method so as to extend from the inside of trench 6 onto each of the upper surfaces of n type source contact layers 4. As the resist film, there can be used a resist film having an opening pattern in conformity with the bottom portion of trench 6 and a portion of the upper surface of n type source contact layer 4. By implanting ions of an impurity of p type conductivity using this resist film as a mask, an electric field relaxing region 7 is formed at the bottom portion of trench 6, and contact region 5 of p type conductivity is formed at the region of the portion of n type source contact layer 4. Thereafter, the resist film is removed. As a result, a structure as shown in FIG. 6 is obtained.

Then, an activation annealing step is performed to activate the impurity implanted by means of the above-described ion implantation. In this activation annealing step, the annealing treatment is performed without forming a particular cap layer on the surface of the epitaxial layer made of silicon carbide. Here, the inventors have found that even when the activation annealing treatment is performed without forming a protective film such as the cap layer on the surface thereof in the case where the above-described {03-3-8} plane is employed, a property of the surface is never deteriorated and sufficient surface smoothness can be maintained. Thus, the conventionally required step of forming the protective film (cap layer) before the activation annealing treatment is omitted and the activation annealing step is directly performed. It should be noted that the above-described cap layer may be formed before performing the activation annealing step. Alternatively, for example, the cap layer may be provided only on the upper surfaces of n type source contact layer 4 and p type contact region 5 before performing the activation annealing treatment.

Figure 7:
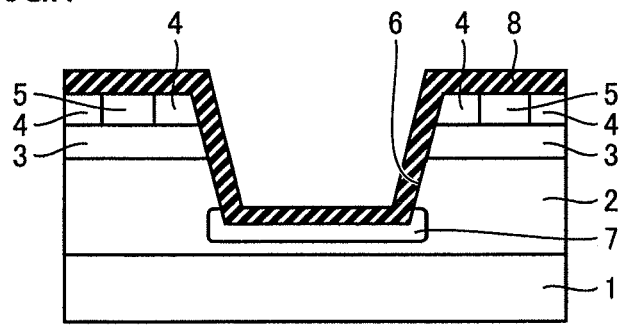
FIG. 7 is a schematic cross sectional view for illustrating the method for manufacturing the semiconductor device shown in FIG. 1.

Next, as shown in FIG. 7, gate insulating film 8 is formed to extend from the inside of trench 6 onto the upper surfaces of n type source contact layer 4 and p type contact region 5. As gate insulating film 8, for example, there can be used an oxide film (silicon oxide film) obtained by thermally oxidizing the epitaxial layer made of silicon carbide. In this way, a structure shown in FIG. 7 is obtained.

Figure 8:
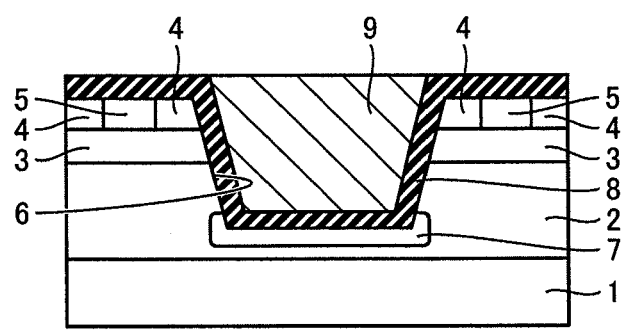
FIG. 8 is a schematic cross sectional view for illustrating the method for manufacturing the semiconductor device shown in FIG. 1.

Next, as shown in FIG. 8, gate electrode 9 is formed on gate insulating film 8 so as to fill the inside of trench 6. As a method for forming gate electrode 9, the following method can be used, for example. First, a sputtering method or the like is employed to form a conductor film on gate insulating film 8. The conductor film is to be the gate electrode extending to the inside of trench 6 and to a region on p type contact region 5. The conductor film may be made of any material such as a metal as long as the material has conductivity. Thereafter, an appropriate method such as an etch back method or a CMP method is used to remove a portion of the conductor film formed on regions other than the inside of trench 6. As a result, the conductor film filling the inside of trench 6 remains to constitute gate electrode 9. In this way, a structure shown in FIG. 8 is obtained.

Next, interlayer insulating film 10 (see FIG. 9) is formed to cover the upper surface of gate electrode 9 and the upper surface of gate insulating film 8 exposed on p type contact region 5. The interlayer insulating film can be made of any material as long as the material is insulative. Further, a resist film having a pattern is formed on interlayer insulating film 10, using the photolithography method. The resist film (not shown) is provided with an opening pattern formed in conformity with a region on p type contact region 5.

Using this resist film as a mask, portions of interlayer insulating film 10 and gate insulating film 8 are removed by means of etching. As a result, openings 11 (see FIG. 9) are formed to extend through interlayer insulating film 10 and gate insulating film 8. Each of openings 11 has a bottom portion at which p type contact region 5 and a portion of n type source contact layer 4 are exposed. Thereafter, a conductor film to serve as source electrode 12 (see FIG. 9) is formed to fill the inside of opening 11 and cover the upper surface of the above-described resist film. Thereafter, the resist film is removed using a chemical solution or the like, thereby simultaneously removing the portion of the conductor film formed on the resist film (lift off). As a result, the conductor film filling the inside of opening 11 constitutes source electrode 12. This source electrode 12 is an ohmic electrode making ohmic contact with p type contact region 5 and n type source contact layer 4.

Figure 9:
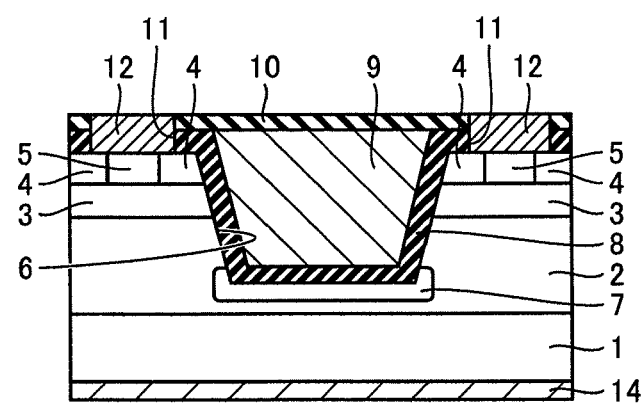
FIG. 9 is a schematic cross sectional view for illustrating the method for manufacturing the semiconductor device shown in FIG. 1.

Further, drain electrode 14 (see FIG. 9) is formed on the backside surface of substrate 1 (the surface thereof opposite to the main surface thereof on which breakdown voltage holding layer 2 is formed). Drain electrode 14 can be made of any material as long as the material allows for ohmic contact with substrate 1. In this way, a structure shown in FIG. 9 is obtained.

Thereafter, an appropriate method such as the sputtering method is employed to form source wire electrode 13 (see FIG. 1) and backside surface protecting electrode 15 (see FIG. 1). Source wire electrode 13 makes contact with each of the upper surfaces of source electrodes 12, and extends on the upper surface of interlayer insulating film 10. Backside surface protecting electrode 15 is formed on the surface of drain electrode 14. As a result, the semiconductor device shown in FIG. 1 can be obtained.

Figure 10:
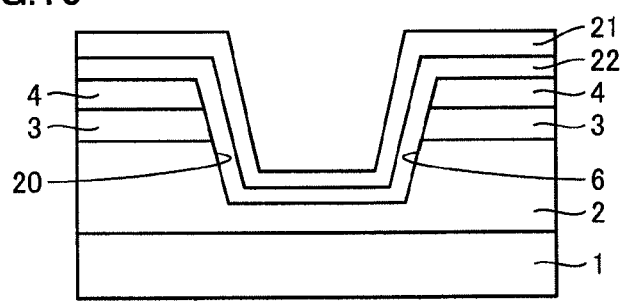
FIG. 10 is a schematic cross sectional view for illustrating a reference example of the method for manufacturing the semiconductor device shown in FIG. 1.
Figure 11:
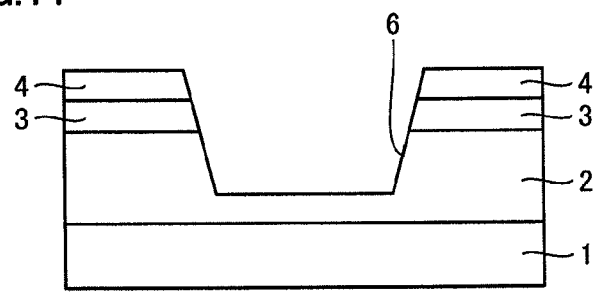
FIG. 11 is a schematic cross sectional view for illustrating the reference example of the method for manufacturing the semiconductor device shown in FIG. 1.

Referring to FIG. 10 and FIG. 11, the following describes a reference example of the method for manufacturing the semiconductor device shown in FIG. 1 in the present invention.

In the reference example of the method for manufacturing the semiconductor device in the present invention, the steps shown in FIG. 2 to FIG. 4 are performed first. Thereafter, mask layer 17 shown in FIG. 4 is removed. Next, a Si film 21 (see FIG. 10) made of silicon is formed to extend from the inside of trench 16 to the upper surface of n type source contact layer 4. In this state, heat treatment is performed to cause reconstitution of silicon carbide at a region in contact with Si film 21 on the inner circumferential surface of trench 16 and the upper surface of n type source contact layer 4. Accordingly, a reconstitution layer 22 of silicon carbide is formed as shown in FIG. 10 such that each of the side walls of the trench corresponds to a predetermined crystal plane ({03-3-8} plane). As a result, a structure as shown in FIG. 10 is obtained.

Thereafter, remaining Si film 21 is removed. Si film 21 can be removed by means of, for example, etching that uses a mixed liquid (gas) of $HNO_3$ and HF or the like. Thereafter, reconstitution layer 22 described above is further removed by means of etching. As etching for removing reconstitution layer 22, ICP-RIE can be used. As a result, trench 6 having its inclined side surface as shown in FIG. 11 can be formed.

Thereafter, by performing the above-described steps shown in FIG. 6 to FIG. 9, the semiconductor device shown in FIG. 1 can be obtained.

Figure 12:
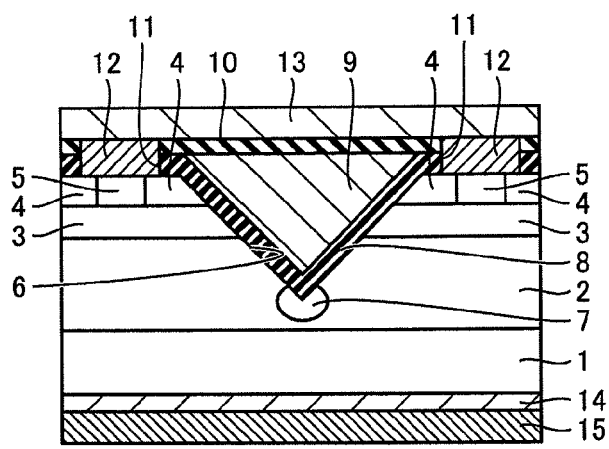
FIG. 12 is a schematic cross sectional view showing a variation of the semiconductor device shown in FIG. 1.

Next, referring to FIG. 12, a variation of the semiconductor device shown in FIG. 1 is described. A semiconductor device shown in FIG. 12 basically has the same configuration as that of the semiconductor device shown in FIG. 1, but is different therefrom in terms of the shape of trench 6. Specifically, in the semiconductor device shown in FIG. 12, trench 6 has a V-shaped cross sectional shape. Further, from a different point of view, trench 6 of the semiconductor device shown in FIG. 12 has side surfaces inclined relative to the main surface of substrate 1, opposite to each other, and connected to each other at their lower portions. At the bottom portion of trench 6 (the portion at which the lower portions of the opposite side walls are connected to each other), electric field relaxing region 7 is formed. With the semiconductor device thus configured, there can be provided the same effect as that of the semiconductor device shown in FIG. 1. Further, in the semiconductor device shown in FIG. 12, trench 6 does not have the flat bottom surface shown in FIG. 1. Accordingly, trench 6 shown in FIG. 12 has a width narrower than that of trench 6 shown in FIG. 1. As a result, the semiconductor device shown in FIG. 12 can be reduced in size as compared with the semiconductor device shown in FIG. 1. This is advantageous in attaining finer design and higher integration in the semiconductor device.

Second Embodiment

Figure 13:
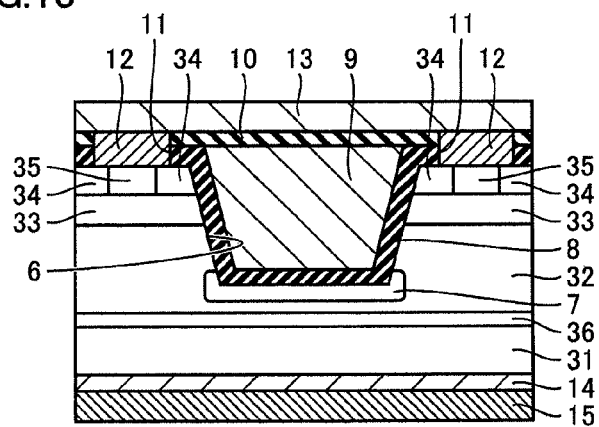
FIG. 13 is a schematic cross sectional view showing a second embodiment of the semiconductor device according to the present invention.

Referring to FIG. 13, the following describes a second embodiment of the semiconductor device in the present invention.

Referring to FIG. 13, the semiconductor device in the present invention is an IGBT, which is a vertical type device utilizing a trench having an inclined side surface. The semiconductor device shown in FIG. 13 includes: a substrate 31 made of silicon carbide and having p type conductivity; a p type epitaxial layer 36 made of silicon carbide and serving as a buffer layer having p type conductivity; an n type epitaxial layer 32 made of silicon carbide and serving as a breakdown voltage holding layer having n type conductivity; p type semiconductor layers 33 made of silicon carbide and corresponding to a well region having p type conductivity; n type source contact layers 34 made of silicon carbide and corresponding to an emitter region having n type conductivity; contact regions 35 made of silicon carbide and having p type conductivity; gate insulating film 8; gate electrode 9; interlayer insulating film 10; source electrode 12 corresponding to an emitter electrode; source wire electrode 13; drain electrode 14 corresponding to a collector electrode; and backside surface protecting electrode 15.

P type epitaxial layer 36 is formed on one main surface of substrate 31. On p type epitaxial layer 36, n type epitaxial layer 32 is formed. On n type epitaxial layer 32, each of p type semiconductor layers 33 is formed. On p type semiconductor layer 33, n type source contact layer 34 is formed. P type contact region 35 is formed to be surrounded by n type source contact layer 34. Trench 6 is formed by removing portions of n type source contact layer 34, p type semiconductor layer 33, and n type epitaxial layer 32. Each of the side walls of trench 6 serves an end surface inclined relative to the main surface of substrate 31. The inclined end surface surrounds a projection portion (projection-shaped portion having an upper surface on which source electrode 12 is formed). The projection portion has, for example, a hexagonal planar shape.

Gate insulating film 8 is formed on the side walls and bottom wall of trench 6. Gate insulating film 8 extends onto the upper surface of n type source contact layer 34. Gate electrode 9 is formed on gate insulating film 8 to fill the inside of trench 6. Gate electrode 9 has an upper surface substantially as high as the upper surface of a portion of gate insulating film 8 on the upper surface of n type source contact layer 34.

Interlayer insulating film 10 is formed to cover gate electrode 9 as well as the portion of gate insulating film 8 extending onto the upper surface of n type source contact layer 34. By removing portions of interlayer insulating film 10 and gate insulating film 8, openings 11 are formed to expose portions of n type source contact layers 34 and p type contact regions 35. Source electrodes 12 are formed in contact with p type contact regions 35 and the portions of n type source contact layers 34 so as to fill the inside of openings 11. Source wire electrode 13 is formed in contact with the upper surface of source electrode 12 so as to extend on the upper surface of interlayer insulating film 10.

Further, as with the semiconductor device shown in FIG. 1, drain electrode 14 and backside surface protecting electrode 15 are formed on the backside surface of substrate 1 opposite to its main surface on which breakdown voltage holding layer 2 is formed.

As with the semiconductor device shown in FIG. 1, in the semiconductor device shown in FIG. 13, each of the side walls of trench 6 is inclined and substantially corresponds to one of the {03-3-8} plane and the {01-1-4} plane in a case where the silicon carbide constituting n type epitaxial layer 32 and the like is of hexagonal crystal type. Further, the inclined side wall of trench 6 substantially corresponds to the {100} plane in a case where the silicon carbide constituting n type epitaxial layer 32 and the like is of cubic crystal type. Also in this case, an effect similar to that of the semiconductor device shown in FIG. 1 can be obtained.

The following briefly describes operations of the semiconductor device shown in FIG. 13. Referring to FIG. 13, when a negative voltage is applied to gate electrode 9 and exceeds a threshold value, an inversion layer is formed at an end region (channel region) of p type semiconductor layer 33 that is in contact with gate insulating film 8 disposed lateral to gate electrode 9 and that faces trench 6. Accordingly, n type source contact layer 34 serving as the emitter region and n type epitaxial layer 32 serving as the breakdown voltage holding layer are electrically connected to each other. Thereby, positive holes are injected from n type source contact layer 34 serving as the emitter region to n type epitaxial layer 32 serving as the breakdown voltage holding layer. Correspondingly, electrons are supplied from substrate 31 to n type epitaxial layer 32 via p type epitaxial layer 36 serving as the buffer layer. As a result, the IGBT is brought into the ON state. Accordingly, conductivity modulation takes place in n type epitaxial layer 32 to decrease a resistance between source electrode 12 serving as the emitter electrode and drain electrode 14 serving as the collector electrode, thus allowing a current to flow therein. On the other hand, when the negative voltage applied to gate electrode 9 is equal to or smaller than the threshold value, the inversion layer is not formed in the channel region. Hence, the reverse-biased state is maintained between n type epitaxial layer 32 and p type semiconductor layer 33. As a result, the IGBT is brought into the OFF state, whereby no current flows therein.

Referring to FIG. 14 to FIG. 21, the following describes a method for manufacturing the semiconductor device of the second embodiment in the present invention.

Figure 14:
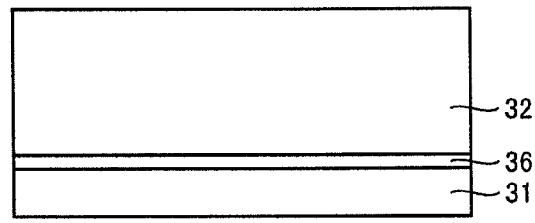
FIG. 14 is a schematic cross sectional view for illustrating a method for manufacturing the semiconductor device shown in FIG. 13.

First, referring to FIG. 14, on the main surface of substrate 31 made of silicon carbide, p type epitaxial layer 36 made of silicon carbide having p type conductivity is formed. Further, on p type epitaxial layer 36, n type epitaxial layer 32 of silicon carbide having n type conductivity is formed. N type epitaxial layer 32 serves as the breakdown voltage holding layer. P type epitaxial layer 36 and n type epitaxial layer 32 are formed by means of epitaxial growth employing the CVD method that utilizes a mixed gas of silane ($SiH_4$) and propane ($C_3H_8$) as a material gas, and utilizes hydrogen gas ($H_2$) as a carrier gas, for example. In doing so, it is preferable to introduce, for example, aluminum (Al) as an impurity of p type conductivity, and to introduce, for example, nitrogen (N) or phosphorus (P) as an impurity of n type conductivity.

Next, ions are implanted into the upper surface layer of n type epitaxial layer 32, thereby forming p type semiconductor layer 33 and n type source contact layer 34. In the ion implantation for forming p type semiconductor layer 33, ions of an impurity of p type conductivity such as aluminum (Al) are implanted. In doing so, by adjusting acceleration energy of the ions to be implanted, the depth of the region in which p type semiconductor layer 33 is to be formed can be adjusted.

Figure 15:
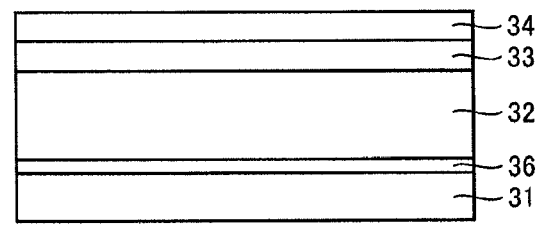
FIG. 15 is a schematic cross sectional view for illustrating the method for manufacturing the semiconductor device shown in FIG. 13.

Next, ions of an impurity of n type conductivity are implanted into n type epitaxial layer 32 thus having p type semiconductor layer 33 formed therein, thereby forming n type source contact layer 34. An exemplary, usable n type impurity is phosphorus or the like. In this way, a structure shown in FIG. 15 is obtained.

Figure 16:
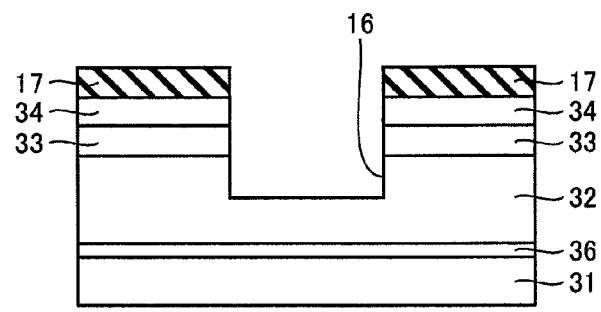
FIG. 16 is a schematic cross sectional view for illustrating the method for manufacturing the semiconductor device shown in FIG. 13.

Next, as shown in FIG. 16, mask layer 17 is formed on the upper surface of n type source contact layer 34. As mask layer 17, an insulating film such as a silicon oxide film can be used. As a method for forming mask layer 17, the same method as the method for manufacturing mask layer 17 as illustrated in FIG. 4 can be used. As a result, mask layer 17 is formed which has an opening pattern in conformity with a region where trench 16 shown in FIG. 16 is to be formed.

Then, using mask layer 17 as a mask, portions of n type source contact layer 34, p type semiconductor layer 33, and n type epitaxial layer 32 are removed by means of etching. As a method or the like for the etching, the same method can be used as that of the step illustrated in FIG. 4. In this way, a structure shown in FIG. 16 is obtained.

Figure 17:
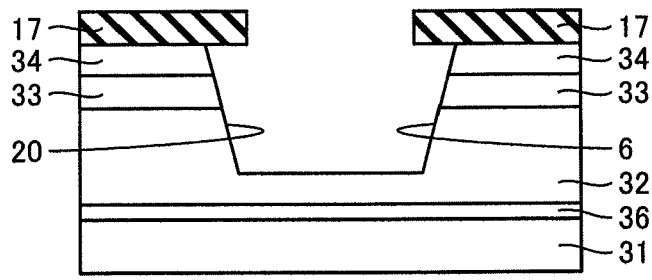
FIG. 17 is a schematic cross sectional view for illustrating the method for manufacturing the semiconductor device shown in FIG. 13.

Next, a thermal etching step is performed to exhibit a predetermined crystal plane in each of n type epitaxial layer 32, p type semiconductor layer 33, and n type source contact layer 34. Conditions for this thermal etching step can be the same as the conditions for the thermal etching step described with reference to FIG. 5. As a result, trench 6 can be formed which has side surfaces 20 inclined relative to the main surface of substrate 31 as shown in FIG. 17. It should be noted that the plane orientation of the crystal plane exhibited at each of side surfaces 20 is, for example, {03-3-8}. In this way, a structure as shown in FIG. 17 is obtained.

Figure 18:
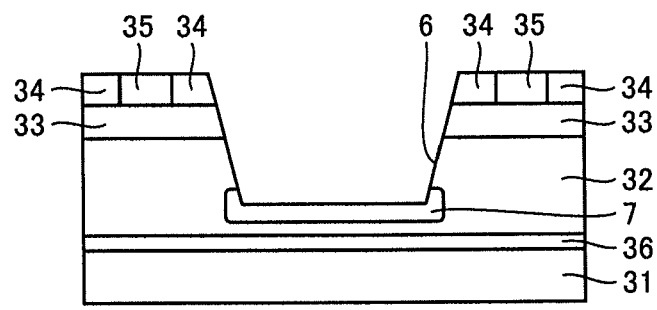
FIG. 18 is a schematic cross sectional view for illustrating the method for manufacturing the semiconductor device shown in FIG. 13.

Next, mask layer 17 is removed by means of any method such as etching. Thereafter, as with the step shown in FIG. 6, a resist film (not shown) having a predetermined pattern is formed using the photolithography method so as to extend from the inside of trench 6 onto the upper surface of n type source contact layer 34. As the resist film, there can be used a resist film having an opening pattern in conformity with the bottom portion of trench 6 and a portion of the upper surface of n type source contact layer 34. By implanting ions of an impurity of p type conductivity using this resist film as a mask, electric field relaxing region 7 is formed at the bottom portion of trench 6, and contact region 35 of p type conductivity is formed at the region of the portion of n type source contact layer 34. Thereafter, the resist film is removed. In this way, a structure as shown in FIG. 18 is obtained.

Then, an activation annealing step is performed to activate the impurity implanted by means of the above-described ion implantation. In this activation annealing step, as with the case of the above-described first embodiment in the present invention, the annealing treatment is performed without forming a particular cap layer on the surface of the epitaxial layer made of silicon carbide (specifically, on side surface 20 of trench 6). It should be noted that the above-described cap layer may be formed before performing the activation annealing step. Alternatively, for example, the cap layer may be provided only on the upper surfaces of n type source contact layer 34 and p type contact region 35 before performing the activation annealing treatment.

Figure 19:
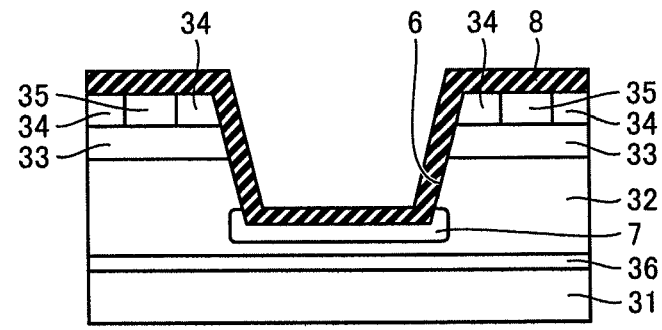
FIG. 19 is a schematic cross sectional view for illustrating the method for manufacturing the semiconductor device shown in FIG. 13.

Next, as shown in FIG. 19, gate insulating film 8 is formed to extend from the inside of trench 6 onto the upper surfaces of n type source contact layer 34 and p type contact region 35. Gate insulating film 8 is made of the same material as that for gate insulating film 8 shown in FIG. 7 and is formed by means of the same method as the method for forming gate insulating film 8 shown in FIG. 7. In this way, a structure shown in FIG. 19 is obtained.

Figure 20:
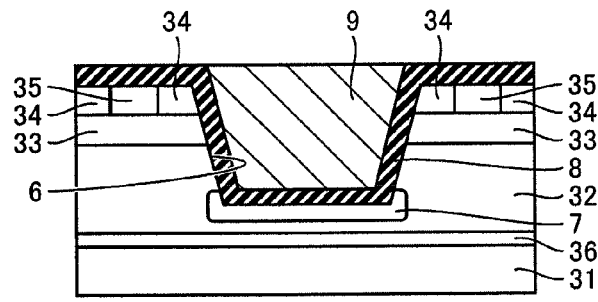
FIG. 20 is a schematic cross sectional view for illustrating the method for manufacturing the semiconductor device shown in FIG. 13.

Next, as shown in FIG. 20, gate electrode 9 is formed on gate insulating film 8 to fill the inside of trench 6. Gate electrode 9 can be formed by means of the same method as the method for forming gate electrode 9 shown in FIG. 8. In this way, a structure shown in FIG. 20 is obtained.

Next, interlayer insulating film 10 (see FIG. 21) is formed to cover the upper surface of gate electrode 9 and the upper surface of gate insulating film 8 exposed on p type contact region 35. Interlayer insulating film 10 can be made of any material as long as the material is insulative. Further, as with the step shown in FIG. 9, openings 11 (see FIG. 21) are formed in interlayer insulating film 10 and gate insulating film 8. Each of openings 11 is formed using the same method as the method for forming the opening in FIG. 9. Opening 11 has a bottom portion at which p type contact region 35 and a portion of n type source contact layer 34 are exposed.

Thereafter, using the same method as the method illustrated in FIG. 9, source electrode 12 is formed of a conductor film filling the inside of opening 11. This source electrode 12 is an ohmic electrode making ohmic contact with p type contact region 35 and n type source contact layer 34.

Figure 21:
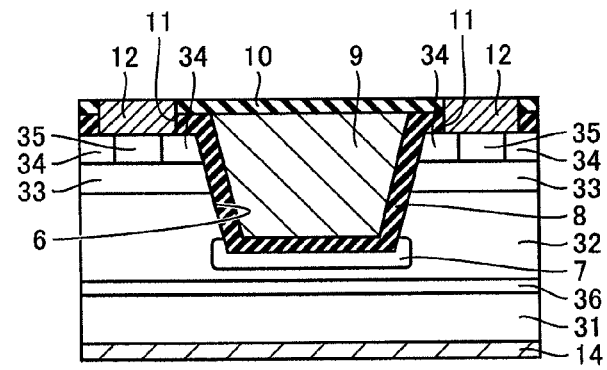
FIG. 21 is a schematic cross sectional view for illustrating the method for manufacturing the semiconductor device shown in FIG. 13.

Further, drain electrode 14 (see FIG. 21) is formed on the backside surface of substrate 31 (the surface thereof opposite to the main surface thereof on which n type epitaxial layer 32 is formed). Drain electrode 14 can be made of any material as long as the material allows for ohmic contact with substrate 31. In this way, a structure shown in FIG. 21 is obtained.

Thereafter, an appropriate method such as the sputtering method is employed to form source wire electrode 13 (see FIG. 13) and backside surface protecting electrode 15 (see FIG. 13). Source wire electrode 13 makes contact with the upper surface of source electrode 12, and extends on the upper surface of interlayer insulating film 10. Backside surface protecting electrode 15 is formed on the surface of drain electrode 14. As a result, the semiconductor device shown in FIG. 13 can be obtained.

Figure 22:
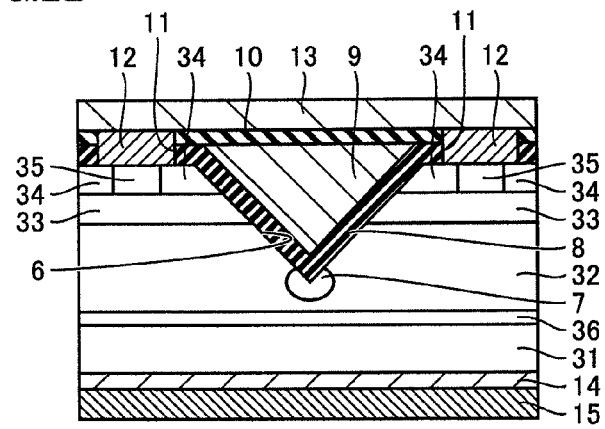
FIG. 22 is a schematic cross sectional view showing a variation of the semiconductor device shown in FIG. 13.

Next, referring to FIG. 22, a variation of the semiconductor device shown in FIG. 13 is described. A semiconductor device shown in FIG. 22 basically has the same configuration as that of the semiconductor device shown in FIG. 13, but is different therefrom in terms of in the shape of trench 6. Specifically, in the semiconductor device shown in FIG. 22, trench 6 has a V-shaped cross sectional shape as with that of the semiconductor device shown in FIG. 12. At the bottom portion of trench 6 (the portion at which the lower portions of the opposite side walls are connected to each other), electric field relaxing region 7 is formed. With the semiconductor device thus configured, there can be provided the same effect as that of the semiconductor device shown in FIG. 13. Further, in the semiconductor device shown in FIG. 22, trench 6 does not have the flat bottom surface shown in FIG. 13. Accordingly, trench 6 shown in FIG. 22 has a width narrower than that of trench 6 shown in FIG. 13. As a result, the semiconductor device shown in FIG. 22 can be reduced in size as compared with the semiconductor device shown in FIG. 13. This is advantageous in attaining finer design and higher integration in the semiconductor device.

Third Embodiment

Figure 23:
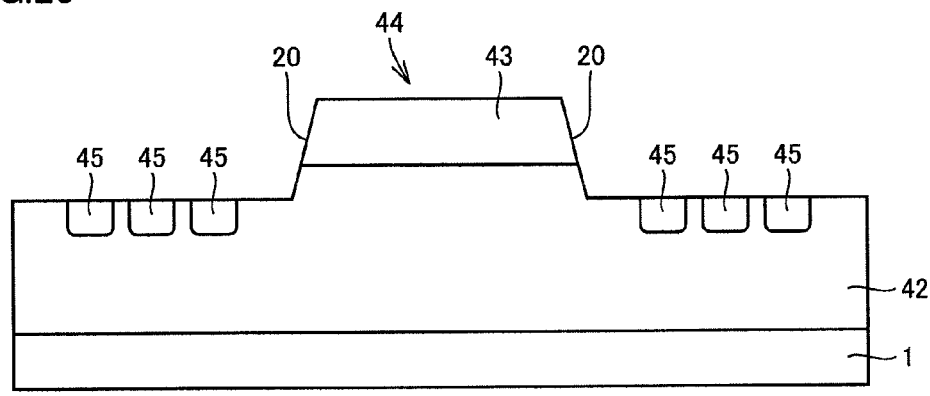
FIG. 23 is a schematic cross sectional view showing a third embodiment of the semiconductor device according to the present invention.

Referring to FIG. 23, the following describes a third embodiment of the semiconductor device in the present invention.

Referring to FIG. 23, the semiconductor device in the present invention is a PiN diode, and includes: substrate 1 made of silicon carbide; an n$^-$ epitaxial layer 42 having n type conductivity, having a conductive impurity concentration lower than that in substrate 1, and having a ridge structure at its surface; a p$^+$ semiconductor layer 43 formed in a ridge structure 44 formed on the surface of n$^-$ epitaxial layer 42 and connected to n$^-$ epitaxial layer 42; and guard rings 45 formed to surround ridge structure 44. Substrate 1 is made of silicon carbide and has n type conductivity. N$^-$ epitaxial layer 42 is formed on the main surface of substrate 1. N$^-$ epitaxial layer 42 has a surface that has ridge structure 44 formed thereon and having side surfaces 20 inclined relative to the main surface of substrate 1. In a layer including the upper surface of ridge structure 44, p$^+$ semiconductor layer 43 having p type conductivity is formed. Guard rings 45, each of which is a region of p type conductivity, are formed to surround this ridge structure 44. Each of guard rings 45 is formed to have an annular shape to surround ridge structure 44. Each of side surfaces 20 of ridge structure 44 is constituted by a specific crystal plane (for example, the {03-3-8} plane). Namely, ridge structure 44 is constituted by six planes equivalent to the specific crystal plane ({03-3-8} plane). Accordingly, ridge structure 44 has its upper surface and bottom portion each having a hexagonal planar shape.

Also in the semiconductor device having such a structure, side surface 20 of ridge structure 44 corresponds to the stable crystal plane as with side surface 20 of trench 6 shown in FIG. 1. Hence, leakage current from side surface 20 can be reduced sufficiently as compared with that in the case where side surface 20 corresponds to another crystal plane.

The following describes a method for manufacturing the semiconductor device shown in FIG. 23. In the method for manufacturing the semiconductor device shown in FIG. 23, substrate 1 made of silicon carbide is first prepared. As substrate 1, for example, there is used a substrate made of silicon carbide of hexagonal crystal type. N$^-$ epitaxial layer 42 is formed on the main surface of substrate 1 using an epitaxial growth method. Into the surface layer of n$^-$ epitaxial layer 42, ions of an impurity of p type conductivity are implanted, thereby forming a p type semiconductor layer, which is to be p$^+$ semiconductor layer 43.

Thereafter, on a region to serve as ridge structure 44 (see FIG. 23), a mask pattern made of a silicon oxide film and in the form of an island is formed. This mask pattern may be adapted to have, for example, a hexagonal planar shape, but may have any other shape (such as a round shape or a quadrangular shape). With this mask pattern formed, portions of p+ semiconductor layer 43 and n− epitaxial layer 42 are removed by means of etching. As a result, a projection portion to serve as ridge structure 44 is formed below the mask pattern.

Then, a thermal etching step is performed as with the step illustrated in FIG. 5 in the above-described first embodiment of the present invention, thereby removing the side surface of the projection portion by means of the etching to obtain inclined side surface 20 shown in FIG. 23. Thereafter, the mask pattern is removed. Further, a resist film having a predetermined pattern is formed to cover the entire structure. This resist film is provided with an opening pattern in conformity with the regions to be guard rings 45. Using the resist film as a mask, an impurity of p type conductivity is implanted into n− epitaxial layer 42, thereby forming guard rings 45. Thereafter, the resist film is removed. After the ion implantation for forming guard rings 45, an activation annealing treatment is performed. In the activation annealing treatment, heat treatment may be performed without forming a cap layer covering at least side surface 20. As a result, the semiconductor device shown in FIG. 23 can be obtained.

Figure 24:
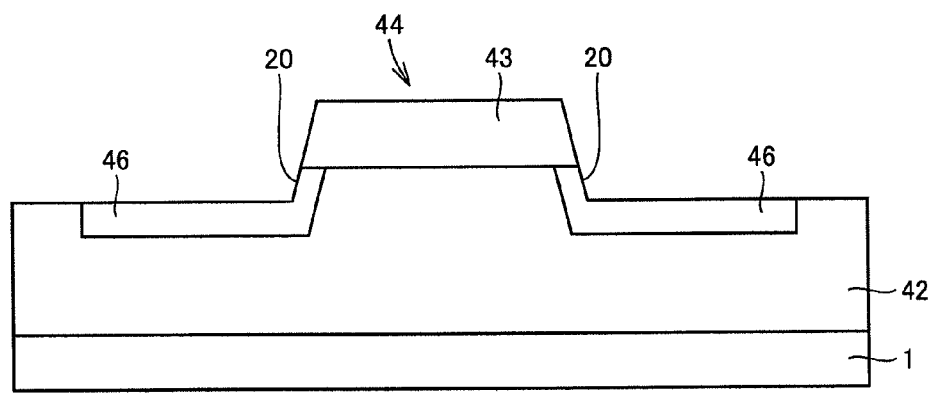
FIG. 24 is a schematic cross sectional view showing a variation of the semiconductor device shown in FIG. 23.

Next, referring to FIG. 24, a variation of the semiconductor device shown in FIG. 23 is described.

A semiconductor device shown in FIG. 24 has basically the same structure as that of the semiconductor device shown in FIG. 23, but is different therefrom in that a JTE (Junction Termination Extension) region 46 is formed instead of guard rings 45 (see FIG. 23). JTE region 46 is a region of p type conductivity. Such JTE region 46 can also be formed by performing ion implantation and activation annealing as with those in the formation of guard rings 45 shown in FIG. 23. Then, in the method for manufacturing the semiconductor device shown in FIG. 24, the activation annealing treatment is performed after the ion implantation for forming JTE region 46, without forming a cap layer covering at least side surface 20, as with the method for manufacturing the semiconductor device shown in FIG. 23. Also in this way, side surface 20 is constituted by a stable crystal plane (for example, the {03-3-8} plane). Hence, a problem does not take place, such as side surface 20 having surface roughness resulting from the activation annealing.

The following describes characteristic features of the present invention, although some of them have already been described in the above-described embodiments.

A method for manufacturing a semiconductor device according to the present invention includes the steps of: preparing a silicon carbide layer (breakdown voltage holding layer 2, semiconductor layer 3, n type source contact layer 4, and p type contact region 5 in FIG. 1, or n type epitaxial layer 32, p type semiconductor layer 33, n type source contact layer 34, and p type contact region 35 in FIG. 13, or n− epitaxial layer 42 and p+ semiconductor layer 43 in FIG. 23 and FIG. 24) having a main surface; forming trench 16 in the main surface by removing a portion of the silicon carbide layer; and removing a portion of a side wall of trench 16 by thermal etching.

In this way, by removing a portion of the side wall of trench 16 by thermal etching, the side wall (side surface 20) of the trench can be spontaneously formed to correspond to a semi-polar plane such as the {03-3-8} plane. Further, since a portion of the side wall of trench 16 is removed using thermal etching, a process-damaged layer or the like is not formed in the side wall (side surface 20) of processed trench 6. Therefore, a high-quality semiconductor device using the side wall of trench 6 corresponding to the semi-polar plane as a channel can be manufactured.

Further, when a portion of the side wall of trench 16 is removed by thermal etching as described above, even if a process-damaged layer is generated in the side wall, the process-damaged layer can be removed by sufficiently increasing the thickness of the surface of the side wall to be removed (for example, by setting the thickness of the surface of the side wall to be removed to not less than 0.1 μm).

In the method for manufacturing the semiconductor device, the step of forming trench 16 may include the steps of forming mask layer 17 having an opening pattern on the main surface of the silicon carbide layer, and removing a portion of the silicon carbide layer by etching to form trench 16 using mask layer 17 as a mask. As the etching, for example, reactive ion etching may be used. It should be noted that a physical processing method such as milling may be used to form trench 16.

In this case, even if a residue occurs within the opening pattern in mask layer 17, the residue is also removed together with a portion of the silicon carbide layer when trench 16 is formed in the step of forming trench 16. Accordingly, the residue is not present when the step of removing a portion of the side wall of trench 16 is performed. This can prevent occurrence of a problem that the side wall of trench 6 subjected to the step of removing a portion of the side wall has a shape deviated from a designed shape due to the presence of the residue.

It should be noted that the opening pattern in the mask layer can have any shape, such as the shape of a line (for example, a stripe) or a curve. For example, as a shape of the mask layer, a plurality of island-like patterns each having a regular hexagonal planar shape may be aligned and arranged (for example, arranged to form a triangular lattice) with the opening pattern interposed therebetween. Further, the planar shape of the island-like pattern may be any shape other than a regular hexagon (for example, a polygon, a circle, an ellipse, or the like).

In the method for manufacturing the semiconductor device, in the step of removing, the thermal etching may be performed with mask layer 17 remaining on the main surface of the silicon carbide layer. In this case, when the thermal etching is performed, mask layer 17 covers a region which is the main surface of the silicon carbide layer and is adjacent to trench 16, capable of preventing the main surface of the silicon carbide layer from being damaged by the thermal etching.

In the method for manufacturing the semiconductor device, the opening pattern in mask layer 17 may have a width of not more than 2 μm. Here, when the opening pattern has a width of not more than 2 μm, a residue is likely to occur within the opening pattern. Accordingly, even if thermal etching alone is performed using mask layer 17 as a mask, there is a possibility that the silicon carbide layer below the opening pattern cannot be removed satisfactorily and a trench cannot be formed as a result. However, by forming trench 16 firstly and thereafter performing thermal etching as in the present invention, the residue can be removed when trench 16 is formed firstly, and thus occurrence of such a problem can be reliably prevented.

In the method for manufacturing the semiconductor device, in the step of removing, a process-damaged layer in the side wall of trench 16 may be removed. In this case, in the semiconductor device using the side wall of trench 6 subjected to the step of removing as a channel region, occurrence of a problem that mobility of a carrier in the channel region is reduced due to the presence of a process-damaged layer can be prevented. Therefore, a high-performance semiconductor device can be obtained.

In the method for manufacturing the semiconductor device, in the step of removing, an end surface (side surface 20) inclined relative to the main surface of the silicon carbide layer may be formed by removing a portion of the side wall of trench 16. In this case, an end surface including a semi-polar plane can be formed in the silicon carbide layer having the main surface as an Si plane or a C plane.

In the method for manufacturing the semiconductor device, the end surface (side surface 20) may substantially include one of the {03-3-8} plane and the {01-1-4} plane in the case where the silicon carbide layer is of hexagonal crystal type, and may substantially include the {100} plane in the case where the silicon carbide layer is of cubic crystal type.

In this case, since the end surface (side surface 20) of the silicon carbide layer substantially corresponds to any one of the {03-3-8} plane, the {01-1-4} plane, and the {100} plane, the end surface corresponding to the so-called semi-polar plane can be used as an active region such as a channel region of the semiconductor device. Further, since the end surface (side surface 20) corresponds to the stable crystal plane, a semiconductor device capable of stably reducing leakage current sufficiently and obtaining high breakdown voltage can be achieved in a case where the end surface is employed for the channel region or the like, as compared with a case where another crystal plane (such as the (0001) plane) is employed for the active region.

In the method for manufacturing the semiconductor device, in the step of removing, a portion of the side wall of trench 16 may be removed by heating the silicon carbide layer while exposing the silicon carbide layer to a reaction gas containing oxygen and chlorine, as the thermal etching. In this case, the end surface of the silicon carbide layer can substantially correspond to any one of the {03-3-8} plane, the {01-1-4} plane, and the {100} plane in a reliable manner.

Further, as shown in FIG. 1, FIG. 13, FIG. 23, FIG. 24, and the like, a semiconductor device according to the present invention includes: substrate 1, 31 having a main surface; and a silicon carbide layer (breakdown voltage holding layer 2, semiconductor layer 3, n type source contact layer 4, and p type contact region 5 in FIG. 1, or n type epitaxial layer 32, p type semiconductor layer 33, n type source contact layer 34, and p type contact region 35 in FIG. 13, or n epitaxial layer 42 and p⁺ semiconductor layer 43 in FIG. 23 and FIG. 24). The silicon carbide layer is formed on the main surface of substrate 1, 31. The silicon carbide layer includes side surface 20 serving as an end surface inclined relative to the main surface. Side surface 20 substantially includes one of the {03-3-8} plane and the {01-1-4} plane in the case where the silicon carbide layer is of hexagonal crystal type. Side surface 20 substantially includes the {100} plane in the case where the silicon carbide layer is of cubic crystal type.

In this way, side surface 20 formed in the silicon carbide layer substantially corresponds to any one of the {03-3-8} plane, the {01-1-4} plane, and the {100} plane. Hence, side surface 20 corresponding to the so-called semi-polar plane can be used as an active region (for example, a channel region) of the semiconductor device. Because side surface 20 thus corresponds to the stable crystal plane, leakage current can be reduced sufficiently and high breakdown voltage can be obtained in a case where such side surface 20 is employed for the active region such as the channel region, as compared with a case where another crystal plane (such as the (0001) plane) is employed for the channel region.

In the present specification, the case where side surface 20 of trench 6 corresponds to any one of the {03-3-8} plane, the {01-1-4} plane, and the {100} plane encompasses a case where there are a plurality of crystal planes constituting the side surface of trench 6, and the plurality of crystal planes include any one of the {03-3-8} plane, the {01-1-4} plane, and the {100} plane. The following specifically describes an exemplary case where the side surface of trench 6 corresponds to the {03-3-8} plane.

Figure 25:
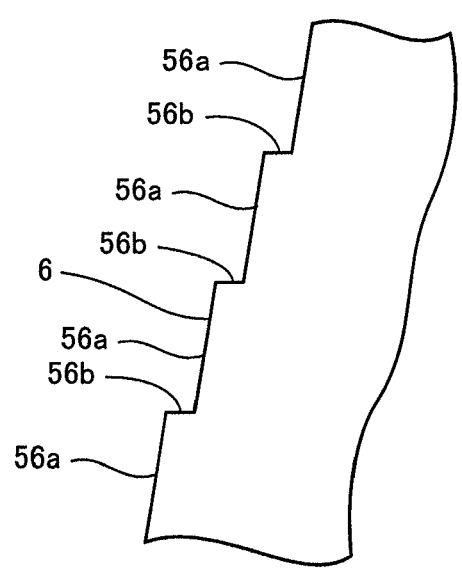
FIG. 25 is an enlarged partial schematic cross sectional view of a side surface of a silicon carbide layer.

In the present invention, the {03-3-8} plane also includes a chemically stable plane constituted by, for example, alternately providing a plane 56a (first plane) and a plane 56b (second plane) in the side surface of trench 6 as shown in FIG. 25, microscopically. Plane 56a has a plane orientation of {03-3-8} whereas plane 56b, which is connected to plane 56a, has a plane orientation different from that of plane 56a. Here, the term "microscopically" refers to "minutely to such an extent that at least the size about twice as large as an interatomic spacing is considered". Preferably, plane 56b has a plane orientation of {0-11-1}. Further, plane 56b in FIG. 25 may have a length (width) twice as large as the interatomic spacing of Si atoms (or C atoms), for example.

Further, the following describes an exemplary case where the side surface of the trench corresponds to the {01-1-4} plane. In the present invention, the {01-1-4} plane also includes a chemically stable plane constituted by alternately providing plane 56a (first plane) and plane 56b (second plane) as shown in FIG. 25, microscopically. Plane 56a has a plane orientation of {01-1-4} whereas plane 56b, which is connected to plane 56a, has a plane orientation different from that of plane 56a. Furthermore, the following describes an exemplary case where the side surface of the trench corresponds to the {100} plane. In the present invention, the {100} plane also includes a chemically stable plane constituted by alternately providing plane 56a (first plane) and plane 56b (second plane) as shown in FIG. 25, microscopically. Plane 56a has a plane orientation of {100} whereas plane 56b, which is connected to plane 56a, has a plane orientation different from that of plane 56a.

In the semiconductor device, side surface 20 may include an active region as shown in FIG. 1 or FIG. 13. Further, in the semiconductor device, specifically, the active region includes a channel region. In this case, the above-described characteristics such as reduced leakage current and high breakdown voltage can be securely obtained.

In the semiconductor device, the silicon carbide layer may include a mesa structure having a side surface constituted by side surface 20 described above as shown in FIG. 23 and FIG. 24, at its main surface located opposite to its surface facing substrate 1, 31. In the mesa structure, a PN junction (junction between n⁻ epitaxial layer 42 and p⁺ semiconductor layer 43 in FIG. 23 or FIG. 24) may be formed. In this case, side surface 20 serving as the side wall of the mesa structure corresponds to the above-described crystal plane. Accordingly, leakage current from side surface 20 can be reduced.

In the semiconductor device, as shown in FIG. 24, at least a portion of side surface 20 may constitute a termination structure (JTE region 46). In this case, leakage current can be reduced in the termination structure formed in side surface 20, and breakdown voltage in the termination structure can be high.

Further, a method for manufacturing a semiconductor device according to the present invention includes the steps of: preparing substrate 1, 31 on which a silicon carbide layer is formed as shown in FIG. 3 or FIG. 15; forming an end surface (side surface 20) inclined relative to a main surface of the silicon carbide layer as shown in FIG. 4 and FIG. 5 or FIG. 16 and FIG. 17; and forming a structure included in the semiconductor device, using the end surface (side surface 20) as shown in FIG. 6 to FIG. 11 or FIG. 18 to FIG. 21. In the step of forming the end surface (side surface 20), a portion of the main surface of the silicon carbide layer is removed by etching by heating the silicon carbide layer while exposing the silicon carbide layer to a reaction gas containing oxygen and chlorine. Accordingly, the end surface (side surface 20) inclined relative to the main surface of the silicon carbide layer (for example, the upper surface of n type source contact layer 4, 34 in FIG. 5, FIG. 17) is formed. The end surface (side surface 20) substantially includes one of the {03-3-8} plane and the {01-1-4} plane in the case where the silicon carbide layer is of hexagonal crystal type, and substantially includes the {100} plane in the case where the silicon carbide layer is of cubic crystal type. In this case, the semiconductor device according to the present invention can be readily manufactured.

Further, a method for processing a substrate according to the present invention includes the steps of: preparing substrate 1, 31 on which a silicon carbide layer is formed as shown in FIG. 3 or FIG. 15; and forming an end surface (side surface 20) inclined relative to a main surface of the silicon carbide layer as shown in FIG. 4 and FIG. 5 or FIG. 16 and FIG. 17. In the step of forming the end surface (side surface 20), a portion of the main surface of the silicon carbide layer is removed by etching by heating the silicon carbide layer while exposing the silicon carbide layer to a reaction gas containing oxygen and chlorine. Accordingly, side surface 20 inclined relative to the main surface of the silicon carbide layer is formed. Side surface 20 substantially includes one of the {03-3-8} plane and the {01-1-4} plane in the case where the silicon carbide layer is of hexagonal crystal type, and substantially includes the {100} plane in the case where the silicon carbide layer is of cubic crystal type. In this case, there can be readily obtained the substrate having the silicon carbide layer formed thereon to have side surface 20 including the above-described crystal plane.

The method for manufacturing the semiconductor device or the method for processing the substrate may further include the step of forming mask layer 17 having a pattern on the main surface of the silicon carbide layer as shown in FIG. 4 or FIG. 16 before the step of forming the end surface (side surface 20). In the step of forming the end surface (side surface 20), etching may be performed using mask layer 17 as a mask. In this case, the location of side surface 20 to be formed can be controlled in accordance with a location of the pattern of mask layer 17. This leads to increased degree of freedom in layout of the semiconductor device to be formed.

Further, it is preferable to remove a portion of the silicon carbide layer in advance by means of the etching employing mask layer 17 as a mask, and thereafter heat the silicon carbide layer while exposing the silicon carbide layer to a reaction gas containing oxygen and chlorine, thereby removing a portion of the main surface of the silicon carbide layer by means of the etching (thermal etching) as shown in FIG. 5 or FIG. 17. In this case, it takes a shorter time to thermally etch it to form side surface 20, than that in the case where the above-described etching is not performed in advance using mask layer 17 as a mask.

In the method for manufacturing the semiconductor device or the method for processing the substrate, a ratio of a flow rate of oxygen to a flow rate of chlorine may be not less than 0.25 and not more than 2.0 in the reaction gas used in the step of forming the end surface (side surface 20). In this case, the end surface including the {03-3-8} plane, the {01-1-4} plane, or the {100} plane can be securely formed.

In the step of forming the end surface (side surface 20) in the method for manufacturing the semiconductor device or the method for processing the substrate, the silicon carbide layer may be heated at a temperature of not less than 700° C. and not more than 1200° C. Further, the lower limit of the temperature for heating can be 800° C., more preferably 900° C. Further, the upper limit of the temperature for heating may be more preferably 1100° C., further preferably 1000° C. In this case, the etching rate can be a sufficiently practical value in the thermal etching step of forming the end surface including the {03-3-8} plane, the {01-1-4} plane, or the {100} plane. Accordingly, the process time in this step can be sufficiently short.

Further, the upper surface of the silicon carbide layer may correspond to a C plane or an Si plane. Further, side surface 20 of trench 6 may include at least two planes of equivalent plane orientations having six-fold symmetry in a silicon carbide crystal.

EXAMPLE

Experiments as described below were conducted to confirm the effect of the present invention.

Samples

Three substrates made of silicon carbide were prepared to form samples 1 to 3. Each substrate had a main surface having an off angle of 8° relative to the (0001) plane. Then, on the main surface of each substrate, an epitaxial layer of silicon carbide was formed. The epitaxial layer had a thickness of 10 μm.

Subsequently, on a surface of the epitaxial layer, a mask layer made of a silicon oxide film was formed using the CVD method. The mask layer had a thickness of 0.05 μm. Then, on the mask layer, a resist film having a pattern was formed using the photolithography method. The pattern of the resist film was configured such that island-like patterns each having a regular hexagonal planar shape were aligned with an opening interposed therebetween. A regular hexagon had a side length of 4.0 μm. The width of the opening (i.e., a distance between adjacent island-like patterns) was set to 4 μm in sample 1, and 2 μm in samples 2 and 3.

DESCRIPTION OF EXPERIMENTS

Experiment 1

Thermal etching was performed on samples 1 and 2 to remove the silicon carbide layer exposed between the island-like patterns, using the mask layer as a mask. Specifically, a mixed gas of oxygen gas and chlorine gas was used as a reaction gas, and the heat treatment temperature was set to 900° C. Further, the flow rate of the oxygen gas was set to 1.5 slm, and the flow rate of the chlorine gas was set to 1.5 slm. Furthermore, the treatment time was set to 15 minutes.

Experiment 2

Reactive ion etching (RIE) was performed on sample 3 to remove the silicon carbide layer exposed between the island-like patterns, using the mask layer as a mask, and form a trench. As process conditions for the RIE, the power was set to 800 W, the bias was set to 10 W, and the flow rate of $SF_6$ was set to 20 sccm.

In addition, thermal etching was performed after the RIE. Conditions for the thermal etching were basically the same as those in Experiment 1 described above, except for the treatment time. Specifically, the thermal etching was performed on sample 3 for 10 minutes.

Results

Result of Experiment 1

Figure 26:
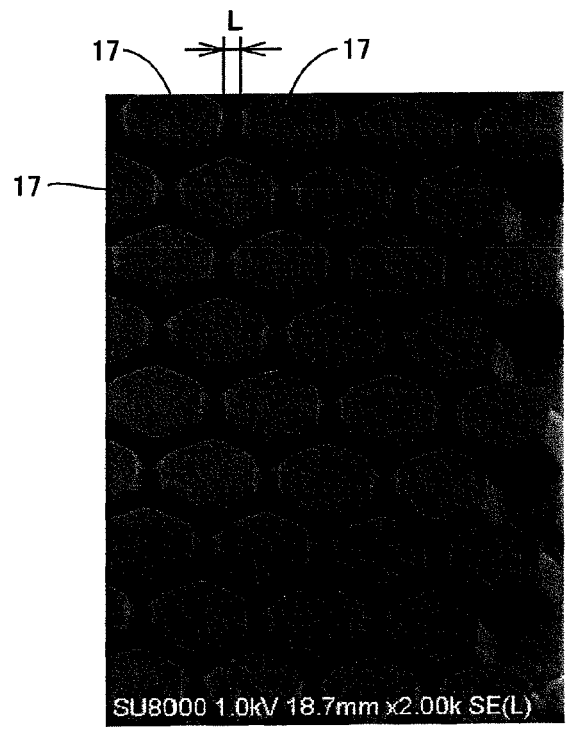
FIG. 26 is a scanning electron microscope photograph showing a result of an experiment on a sample 1.

The result of experiment 1 is described with reference to FIG. 26 and FIG. 27. As can be seen in FIG. 26, in sample 1, the silicon carbide layer between mask layers 17 was removed by etching, and a trench was neatly formed. In sample 1 in which a width L of the opening as the distance between mask layers 17 was set to 4 μm, the silicon carbide layer exposed between mask layers 17 was removed by thermal etching, and the trench having an inclined side surface was formed.

Figure 27:
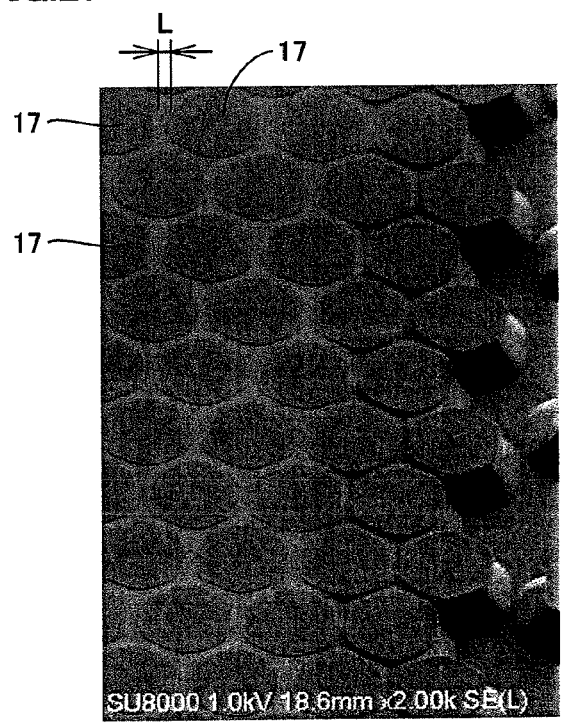
FIG. 27 is a scanning electron microscope photograph showing a result of an experiment on a sample 2.

On the other hand, as shown in FIG. 27, in sample 2 in which width L of the opening between mask layers 17 was set to 2 μm, the silicon carbide layer exposed from the opening was not able to be sufficiently removed by thermal etching alone, and there remained a portion in which a trench was not formed.

Result of Experiment 2

In sample 3 processed in experiment 2, the silicon carbide layer exposed between mask layers 17 was almost removed, and a trench was thoroughly formed between mask layers 17, as with sample 1 shown in FIG. 26. Thus, even under the condition that the opening between mask layers 17 has a relatively narrow width of 2 μm, it was possible according to the present invention to form a trench in a reliable manner.

The embodiments disclosed herein are illustrative and non-restrictive in any respect. The scope of the present invention is defined by the terms of the claims, rather than the above description, and is intended to include any modifications within the scope and meaning equivalent to the terms of the claims.

INDUSTRIAL APPLICABILITY

The present invention is particularly advantageously applied to a semiconductor device employing a silicon carbide layer.

REFERENCE SIGNS LIST 1, 31: substrate; 2: breakdown voltage holding layer; 3: p type body layer (p type semiconductor layer); 4, 34: n type source contact layer; 5, 35: contact region; 6, 16: trench; 7: electric field relaxing region; 8: gate insulating film; 9: gate electrode; 10: interlayer insulating film; 11: opening; 12: source electrode; 13: source wire electrode; 14: drain electrode; 15: backside surface protecting electrode; 17: mask layer; 20: side surface; 21: Si film; 22: SiC reconstitution layer; 32: n type epitaxial layer; 33: p type semiconductor layer; 36: p type epitaxial layer; 42: $n^-$ epitaxial layer; 43: $p^+$ semiconductor layer; 44: ridge structure; 45: guard ring; 46: JTE region.

The invention claimed is:

1. A method for manufacturing a semiconductor device, comprising the steps of:
    preparing a silicon carbide layer having a main surface;
    forming a trench in said main surface having a side wall substantially perpendicular to said main surface, by removing a portion of said silicon carbide layer;
    forming an end surface inclined relative to said main surface and exhibiting a predetermined crystal plane by removing a portion of said side wall of said trench by thermal etching;
    forming a first contact region of a first conductivity type and a second contact region of a second conductivity type on said main surface of said silicon carbide layer;
    forming a gate insulating film to extend from an inside of said trench onto upper surfaces of said first contact region and said second contact region; and
    forming a gate electrode on said gate insulating film so as to extend to an upper portion higher than the upper surfaces of said first contact region and said second contact region.

2. The method for manufacturing the semiconductor device according to claim 1, wherein the step of forming said trench includes the steps of
    forming a mask layer having an opening pattern on said main surface of said silicon carbide layer, and
    removing a portion of said silicon carbide layer by etching to form said trench using said mask layer as a mask.

3. The method for manufacturing the semiconductor device according to claim 2, wherein, in said step of removing, said thermal etching is performed with said mask layer remaining on said main surface of said silicon carbide layer.

4. The method for manufacturing the semiconductor device according to claim 2, wherein said opening pattern in said mask layer has a width of not more than 2 μm.

5. The method for manufacturing the semiconductor device according to claim 1, wherein, in said step of removing, a process-damaged layer in the side wall of said trench is removed.

6. The method for manufacturing the semiconductor device according to claim 1, wherein said end surface substantially includes one of a {03-3-8} plane and a {01-1-4} plane in a case where said silicon carbide layer is of hexagonal crystal type, and substantially includes a {100} plane in a case where said silicon carbide layer is of cubic crystal type.

7. The method for manufacturing the semiconductor device according to claim 1, wherein, in said step of removing, a portion of the side wall of said trench is removed by heating said silicon carbide layer while exposing said silicon carbide layer to a reaction gas containing oxygen and chlorine, as the thermal etching.

* * * * *